(12) United States Patent
Yun et al.

(10) Patent No.: US 8,989,888 B2
(45) Date of Patent: Mar. 24, 2015

(54) AUTOMATIC FAULT DETECTION AND CLASSIFICATION IN A PLASMA PROCESSING SYSTEM AND METHODS THEREOF

(75) Inventors: Gunsu Yun, Pohang (KR); Vijayakumar C. Venugopal, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 504 days.

(21) Appl. No.: 13/381,643

(22) PCT Filed: Jun. 29, 2010

(86) PCT No.: PCT/US2010/040452
§ 371 (c)(1),
(2), (4) Date: Dec. 29, 2011

(87) PCT Pub. No.: WO2011/002798
PCT Pub. Date: Jan. 6, 2011

(65) Prior Publication Data
US 2012/0101622 A1    Apr. 26, 2012

Related U.S. Application Data

(60) Provisional application No. 61/222,098, filed on Jun. 30, 2009.

(51) Int. Cl.
*G06F 19/00* (2011.01)
*H01L 21/00* (2006.01)
(Continued)

(52) U.S. Cl.
CPC ............. *H01J 37/3299* (2013.01); *G06F 17/00* (2013.01); *H01J 37/32935* (2013.01)

USPC ............... 700/110; 700/109; 438/9; 438/474; 438/513; 438/788; 438/792; 702/58

(58) Field of Classification Search
CPC ....................................................... G06F 17/00
USPC ....................................................... 700/110
See application file for complete search history.

(56) References Cited

U.S. PATENT DOCUMENTS 5,710,555 A * 1/1998 McConnell et al. .......... 340/916
5,859,964 A   1/1999 Wang et al.
(Continued)

FOREIGN PATENT DOCUMENTS

CN    1867896 A    11/2006
CN    101258499 A    9/2008
(Continued)

OTHER PUBLICATIONS

Zhang et al. "Fault Detection and Classification through Multivariate Statistical Techniques" from "Proceedings of the American Control Conference, Jun. 1995".*

(Continued)

*Primary Examiner* — Mohammad Ali
*Assistant Examiner* — Yuhui R Pan

(57) ABSTRACT

A method for automatically detecting fault conditions and classifying the fault conditions during substrate processing is provided. The method includes collecting processing data by a set of sensors during the substrate processing. The method also includes sending the processing data to a fault detection/classification component. The method further includes performing data manipulation of the processing data by the fault detection/classification component. The method yet also includes executing a comparison between the processing data and a plurality of fault models stored within a fault library. Each fault model of the plurality of fault models represents a set of data characterizing a specific fault condition. Each fault model includes at least a fault signature, a fault boundary, and a set of principal component analysis (PCA) parameters.

25 Claims, 12 Drawing Sheets

$$\vec{V}_F \equiv \vec{V}_1 - \hat{V}_0 (\hat{V}_1 \cdot \vec{V}_0)$$

(51) Int. Cl.
    *H01L 21/322*     (2006.01)
    *H01L 21/42*     (2006.01)
    *H01L 21/469*     (2006.01)
    *G01R 31/00*     (2006.01)
    *H01J 37/32*     (2006.01)
    *G06F 17/00*     (2006.01)

(56) References Cited

U.S. PATENT DOCUMENTS

| | | | |
|---|---|---|---|
| 2005/0071038 A1* | 3/2005 | Strang | 700/121 |
| 2005/0071039 A1 | 3/2005 | Mitrovic | |
| 2005/0278597 A1* | 12/2005 | Miguelanez et al. | 714/738 |
| 2006/0184264 A1* | 8/2006 | Willis et al. | 700/108 |
| 2009/0185739 A1* | 7/2009 | Amini et al. | 382/144 |

FOREIGN PATENT DOCUMENTS

| | | |
|---|---|---|
| TW | 200835923 A | 9/2008 |
| TW | 200844429 A | 11/2008 |

OTHER PUBLICATIONS

Yue et al. "Weighted Principal Component Analysis and its Applications to Improve FDC Performance" from "43rd IEEE Conference on Decision and Control", Dec. 2004.*

Yoon et al. "Fault diagnosis with multivariate statistical models part I: using steady state fault signatures" from "Journal of Process Control 11 (2001) 387-400".*

"International Preliminary Report on Patentability", PCT Application No. PCT/US2010/040452, Mailing Date: Jan. 12, 2012.

"PCT Written Opinion", PCT Application No. PCT/US2010/040452, Mailing Date: Jan. 20, 2011.

"International Search Report", PCT Application No. PCT/US2010/040452, Mailing Date: Jan. 20, 2011.

Zhang, et al., "Fault Detection and Classification through Multivariate Statistical Techniques", Proceedings of the American Control Conference, Seattle, Washington, Jun. 1995, 5 pages.

Notification of Examiantion Opinion from TW Application No. 99121523 dated Sep. 26, 2014; 10 pages.

* cited by examiner

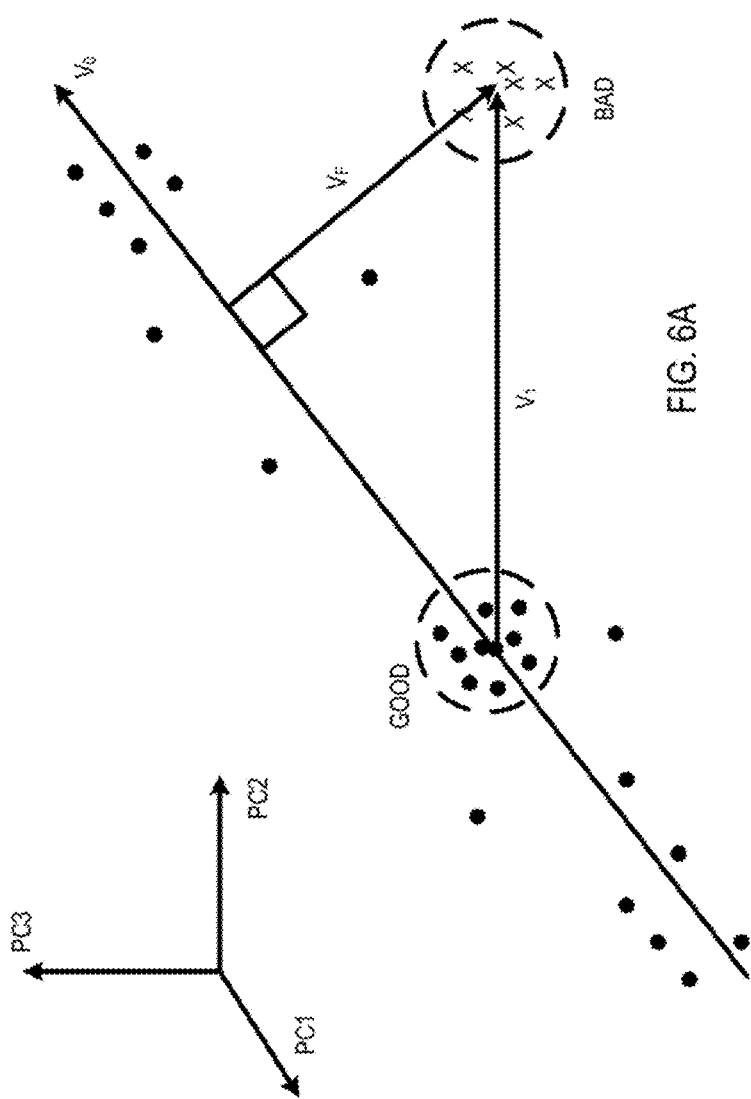

$r_k \equiv V_k \bullet V_F$ $\theta_k \equiv \cos^{-1}(\hat{V}_k \bullet \hat{V}_F)$

AUTOMATIC FAULT DETECTION AND CLASSIFICATION IN A PLASMA PROCESSING SYSTEM AND METHODS THEREOF

PRIORITY CLAIM

The present invention claims priority under 35 U.S.C. 119 (e) to a commonly owned provisionally filed patent application entitled "Automatic Fault Detection and Classification in a Plasma Processing System," U.S. application No. 61/222,098, filed on Jun. 30, 2009, by inventors Yun et al., and under 35 U.S.C. 371 to a PCT Application No. PCT/US2010/040452 filed on Jun. 29, 2010, all of which is incorporated herein by reference.

BACKGROUND OF THE INVENTION

Plasma processing systems have long been employed to process substrates such as semiconductor wafers and flat panels, for example. A plasma processing system may be employed to perform processes such as deposition, etching, cleaning, etc.

In a plasma processing system employed for producing semiconductor devices, for example, it is highly desirable that the plasma processing system produces electronic devices with the highest yield and with the lowest cost of ownership possible. To achieve a high yield and to reduce tool down time, which contributes to a higher cost of ownership, it is critical to detect and classify faults rapidly in order to minimize damage to wafers and/or to the plasma processing system components. A fault condition may arise due to, for example, chamber component malfunction, chamber component wear, incorrectly installed chamber components, and/or any other condition that requires cleaning, maintenance, and/or replacement of one or more subsystems of the plasma processing system.

A modern plasma processing system may employ numerous sensors to monitor various process parameters such as optical emission, voltage, current, pressure, temperature, etc. The data monitoring performed by each sensor may output data at rates of up to hundreds of samples per second or more. Given the large number of sensors involved, a modern plasma processing system may generate a huge volume of sensor data for a given processed wafer. If the analysis of the sensor data is performed manually, it is often impossible to accurately detect and/or classify a fault condition from the voluminous sensor data in a timely manner. If a fault condition is not detected in a timely manner, further processing may result in damage to one or more wafers and/or to chamber components. Even after plasma processing is halted, a large amount of time must be devoted to sifting through the voluminous sensor data to ascertain the fault that occurred in order to facilitate fault remedy.

Manual fault detection and analysis also requires highly skilled engineers to sift through the highly voluminous data. These highly skilled engineers are both in short supply and costly to employ, both of which increase the cost of ownership for the tool owner. The manual process of fault detection and analysis is also error-prone.

There have been attempts in the past to automatically detect fault conditions and to analyze the sensor data to classify faults. These efforts have met varying degrees of success in the production environment and in the marketplace. Engineers are constantly searching for ways to detect fault conditions more quickly and accurately classify faults. This application relates to improved methods and apparatus for automatically detecting fault conditions and for classifying fault conditions in an automatic and timely manner.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 6A, 6B, 6C and 6D show, in accordance with an embodiment of the invention, the steps for defining the fault vector (representing the fault signature) while accounting for chamber drift automatically.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer-readable medium on which computer-readable instructions for carrying out embodiments of the inventive technique are stored. The computer-readable medium may include, for example, semiconductor, magnetic, opto-magnetic, optical, or other forms of computer-readable medium for storing computer-readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Embodiments of the invention relate to a highly automatic, time-efficient, and robust method for fault detection and classification for any sensor data set associated with one or more wafers under test.

Figure 1:
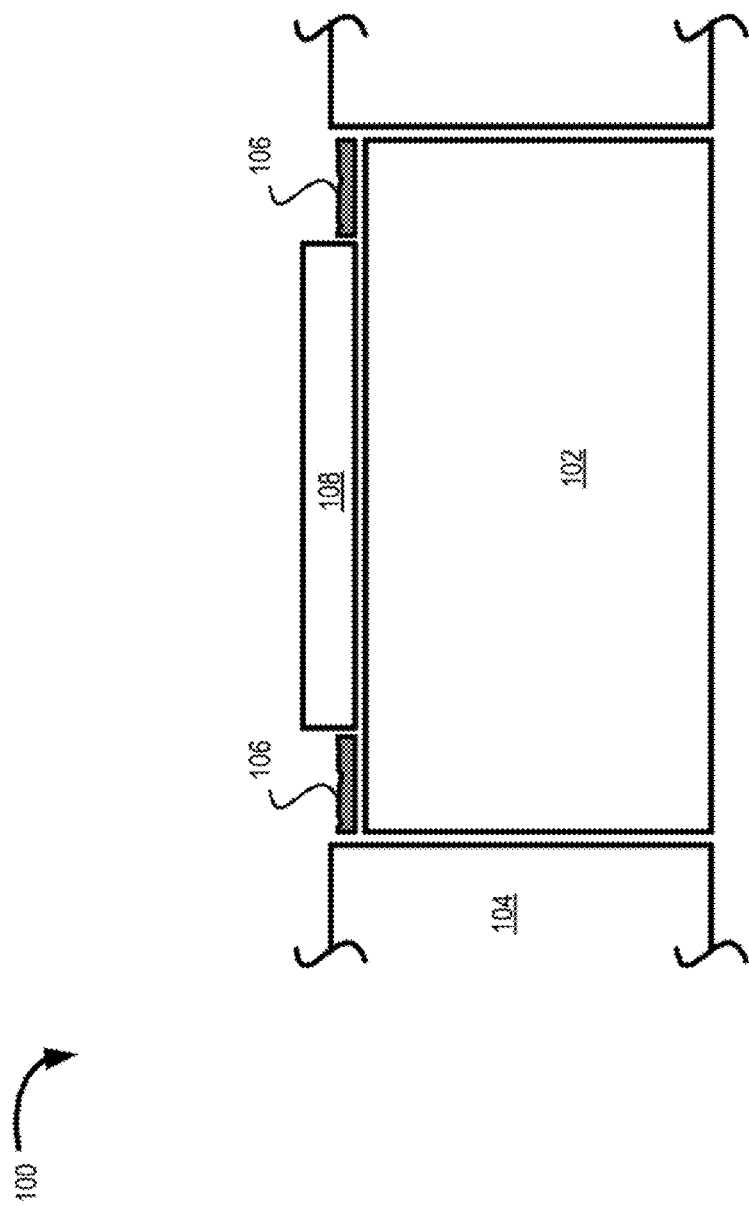
FIG. 1 shows an example lower electrode subsystem, comprising a lower electrode, an outer cover ring, and a top cover ring.

To facilitate discussion, FIG. 1 shows an example lower electrode subsystem 100, comprising a lower electrode 102, an outer cover ring 104, and a top cover ring 106. A wafer 108 is also shown. Top cover ring 106 is shown partly worn away, representing an example fault condition of the type that may affect the plasma and may detrimentally change the process results. In a production setting, the timely detection of the fault condition depicted in FIG. 1 as well as the timely and accurate classification of the fault as one associated with a worn top cover ring would be highly desirable to prevent damage to subsequently processed substrates and/or damage to other components of the plasma processing system and to recover the system quickly after repair/maintenance.

Figure 2:
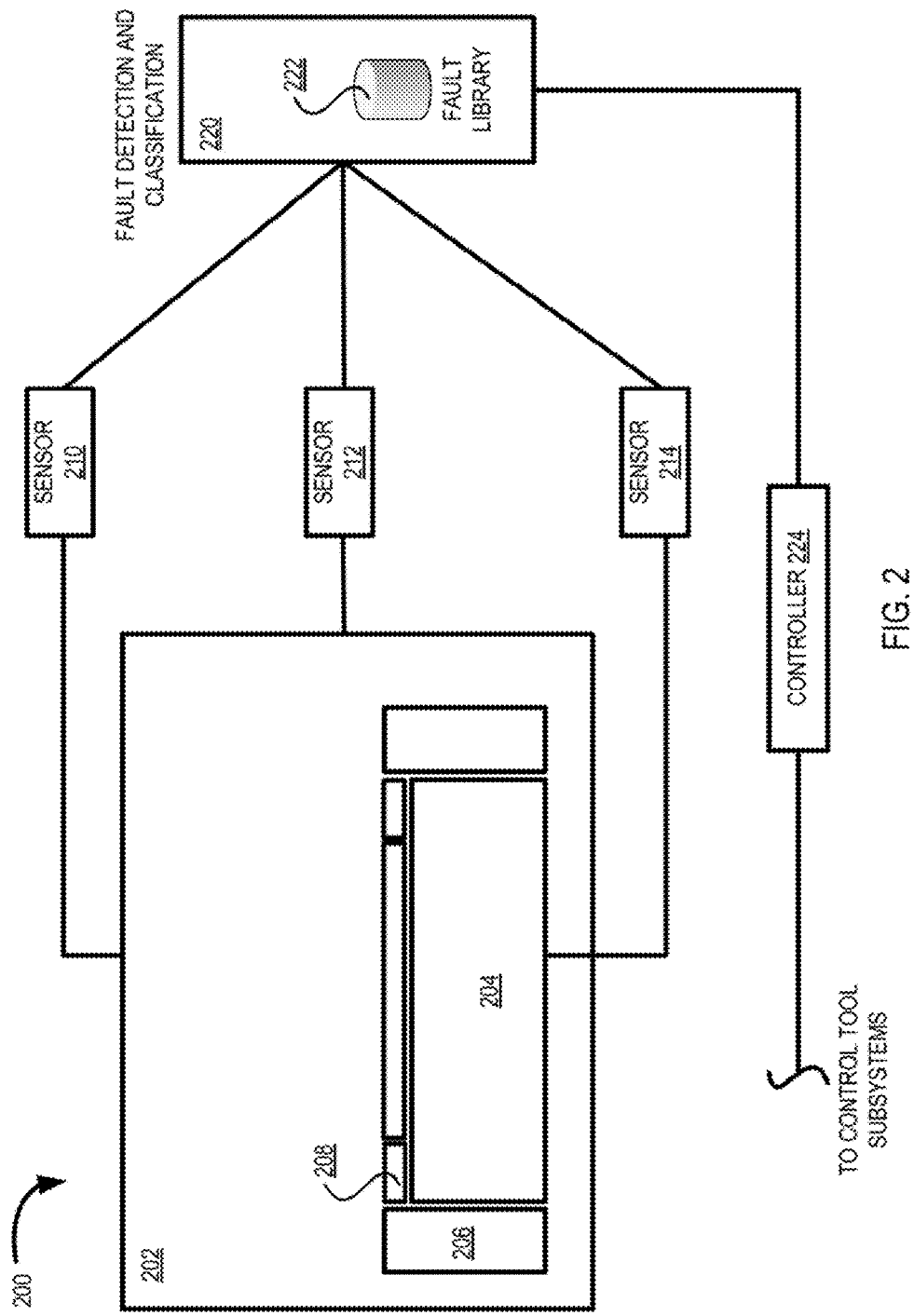
FIG. 2 shows, in accordance with an embodiment of the invention, a logic block diagram of various subcomponents of a plasma processing chamber that is capable of automatic and timely detection of fault conditions as well as automatic and timely classification of faults.

FIG. 2 shows, in accordance with an embodiment of the invention, a logic block diagram of various subcomponents of a plasma processing chamber 200 that is capable of automatic and timely detection of fault conditions as well as automatic and timely classification of faults. With reference to FIG. 2, there is shown a plasma processing chamber 202 having therein a lower electrode subsystem that comprises a lower electrode 204, an outer cover ring 206, and a top cover ring 208. Various other conventional subsystems, such as top electrode, RF generator, turbo pump(s), mass flow controller, temperature control, etc., are omitted for ease of illustration.

A plurality of example sensors 210, 212, and 214 are shown. Sensor 210 may represent, for example, a manometer for monitoring chamber pressure. Sensor 212 may represent, for example, an optical emission sensor for monitoring the optical emission of the plasma in the chamber. Sensor 214 may represent, for example, a V-1 probe. Other sensors may also be employed, as is well known to those skilled in the art.

Sensors 210, 212, and 214 provide sensor data to a fault detection/classification unit 220, which comprises the software and/or hardware for automatically performing fault detection and/or fault classification based on the supplied sensor data. A fault library 222 is shown, representing a database of fault models (each of which includes a fault condition fingerprint). Each fault model is a set of data characterizing a specific fault condition. These fault models are generated in advance, as will be discussed later herein, and are employed for performing fault detection and/or fault classification in accordance with one or more embodiments of the invention.

Fault detection/classification unit 220 receives sensor data from multiple sensors. Due to the large number of sensors present in a typical modern plasma processing system, and the fact that each sensor may send hundreds or more data samples per second, fault detection/classification unit 220 performs inventive data manipulation to render it possible to efficiently and timely detect and/or classify fault. Aspects of the data manipulation to enable timely detection and/or classification of faults are discussed later herein. The fault identification and/or fault classification may be employed by a controller 224 to control the plasma tool (such as, for example, timely stopping the tool before further damage may occur or making in-situ adjustments to remove the fault).

Figure 3:
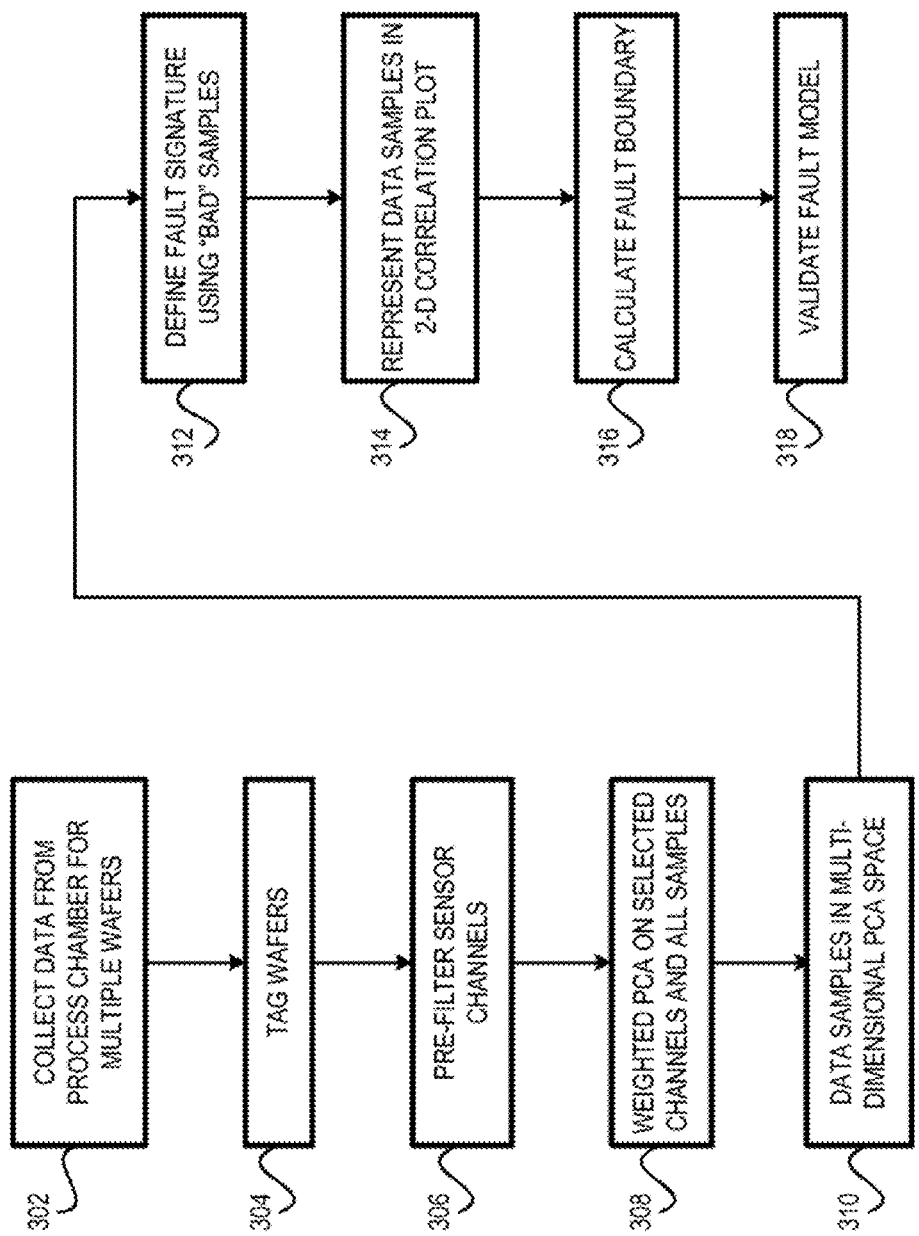
FIG. 3 shows, in accordance with an embodiment of the invention, an example method for generating a fault model.

FIG. 3 shows, in accordance with an embodiment of the invention, an example method for generating a fault model. These fault models are stored in the fault library (e.g., fault library 222) for use during production for fault detection and/or classification. In step 302, sensor data from sensors are collected for multiple wafers. The wafers associated with these sensor data items may be tagged as "bad", "good" or "unknown" (step 304). For example, an engineer may know that a certain wafer or set of wafers are bad due to worn focus rings (whether intentional or not) and may employ the sensor data associated with these wafers to derive a fault model for worn focus rings. The good fault models are also useful for classification purposes, as are any other fault models.

In step 306, the sensor channels are pre-filtered to exclude channels showing little variation. Pre-filtering is one part of data manipulation to reduce the amount of data to be handled during fault detection and/or analysis. Considering the large number of sensors involved and the fact that each sensor may generate hundreds or more data samples per second, data manipulation is a highly useful step for improving the timeliness and efficiency of fault detection/filtering. In an embodiment, data from sensor channels that do not contribute to fault detection (e.g., invariant to the fault in question) would be excluded during pre-filtering. Pre-filtering is discussed in greater detail herein in a subsequent flow chart.

In step 308, weighted principal component analysis (PCA) is performed on the remaining data channels associated with all wafer data samples. Weighted PCA aims to reduce the data dimension and is another part of the data manipulation to reduce the amount of data to be handled to improve the timeliness and efficiency of fault detection/filtering. Weighted PCA is discussed in greater detail herein in a subsequent flow chart. As a result of weighted PCA, the data samples for the wafers are represented in a multi-dimensional PCA space (step 310).

In step 312, the fault signature is defined using, in part, the user-specified "bad" samples. As discussed, the user may specify that certain sensor data sets associated with certain wafers are known "bad" wafer samples and can use these data sets to build a fault signature characterizing this known fault. A fault signature is, generally speaking, a vector in the PCA space. Fault signature is discussed in greater detail herein in a subsequent figure.

In step 314, the data samples associated with the wafers are represented in a 2-D correlation plot. This representation facilitates the efficient analysis of a possible fault condition based on the data samples magnitude (fault severity) and resemblance to a fault signature (angle between the data sample and the fault signature). The representation in a 2-D correlation plot is discussed in greater detail herein in a subsequent figure.

In step 316, the fault boundary (which defines the boundary of data parameters deemed to be a fault) is calculated from the 2-D correlation plot. The calculation of the fault boundary is discussed in greater detail herein in a subsequent figure.

In step 318, the robustness of the fault model is validated. A fault model, as the term is employed herein, comprises at least the fault signature, the fault boundary, and the PCA parameters (e.g., the PCA coefficients associated with the PCA channels after weighted PCA). The validation of the fault model is discussed in greater detail herein in a subsequent figure.

Figure 4:
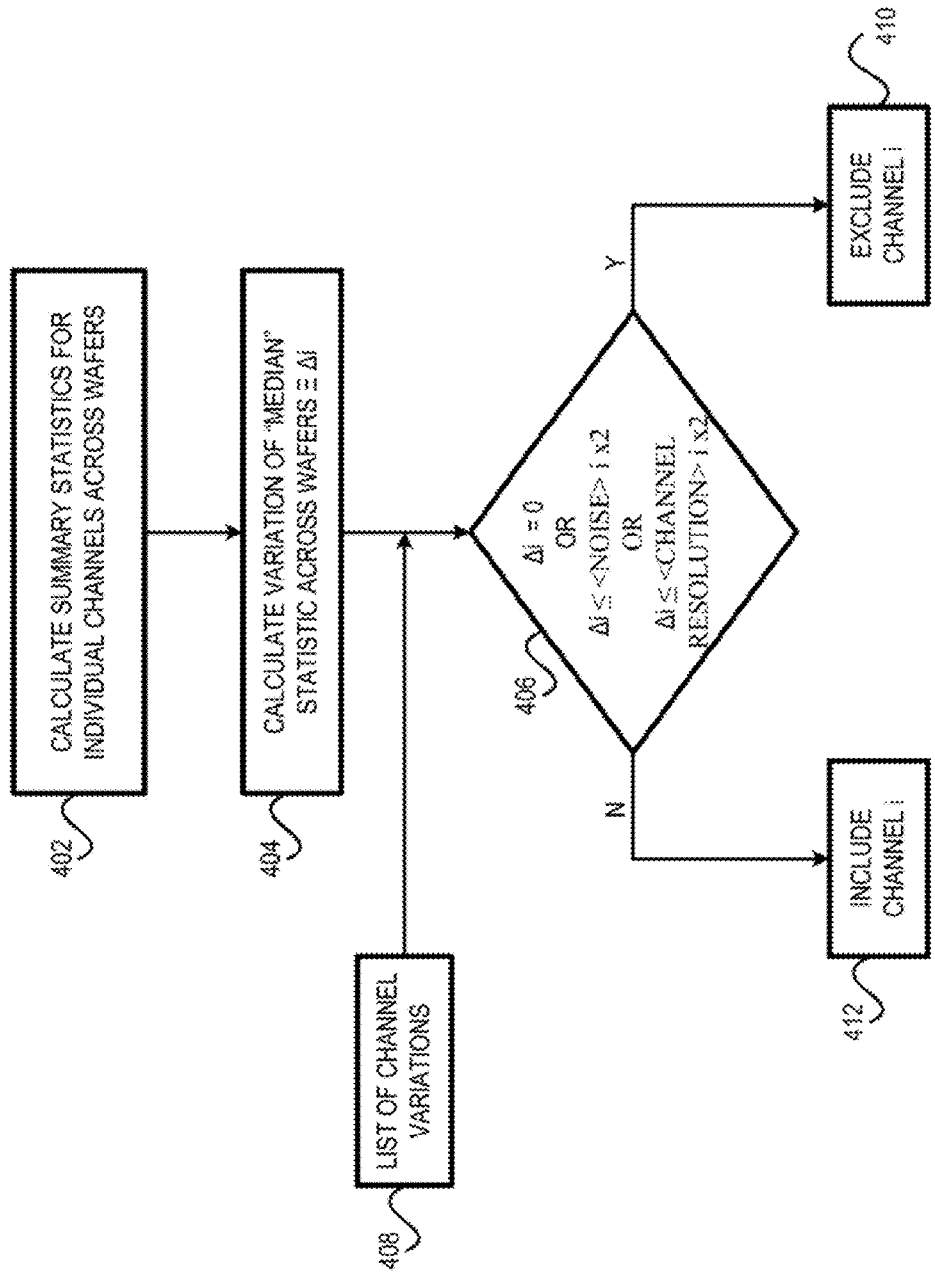
FIG. 4 shows, in accordance with an embodiment of the invention, the steps associated with automatic channel filtering.

FIG. 4 shows, in accordance with an embodiment of the invention, the steps associated with automatic channel filtering (the pre-filtering step 306 of FIG. 3). The steps of FIG. 4 represent one advantageous embodiment—there are other ways to perform pre-filtering to reduce the number of data channels by eliminating channels that do not contribute to the variation.

In step 402, the summary statistics (such as average, median, maximum, minimum, noise, etc.) are calculated for individual channels across all wafers submitted. In an embodiment, the noise may be estimated using a local linear fit. If there are 10 wafers and 200 channels of sensor data, for example, the summary statistics will be calculated for all 200 channels per wafer, and for all 10 wafers as part of step 402, in an embodiment.

In step 404, the variation in the median statistics is calculated for each channel across all wafer samples. For example, if channel #37 measures pressure and 17 mT is the median pressure reading for wafer #5 and 19 mT is the median for wafer #6, the variation in the median statistics is calculated for channel #37 across all wafers. The variation may be expressed by a standard of deviation measure, for example. Median is preferably employed since it tends to give a more reliable statistics regarding the channel data even if some samples in that channel drop out now and then during sensor data collection. However, other statistical measures (such as average) may also be employed in some embodiments.

In step 406, data channels that are deemed to be invariant to the fault condition (i.e., the data does not change appreciably enough to contribute to the discrimination of a fault condition) are excluded. One advantageous method of excluding an invariant data channel involves comparing the aforementioned variation in the median statistics of that channel with certain thresholds, such as a noise threshold for that channel or the channel resolution. The channel resolution depends on the sensor design characteristics and may be read from a pre-populated list in step 408. It should be understood that other methods of excluding invariant data channels may also be employed.

As can be seen in step 406, if the variation in the median statistics of a data channel is zero or if the variation in the median statistics of a data channel is less than some multiple of the noise or if the variation in the median statistics of a data channel is less than some multiple of the channel resolution (i.e., the manufacturing tolerance associated with that channel due to sensor manufacture, transmission line tolerance, etc.), that data channel is deemed to be insufficiently variant to be included. In that case, that data channel is excluded (step 410). Otherwise, the data channel is included for building a fault model and/or for detecting and/or analyzing for faults (step 412).

Figure 5:
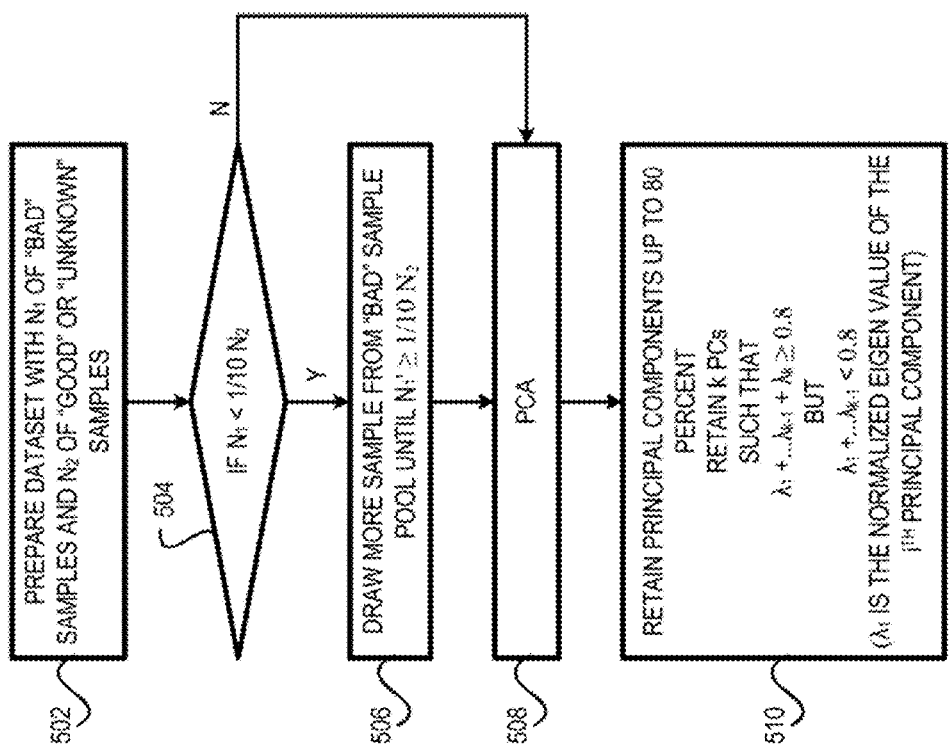
FIG. 5 shows, in accordance with an embodiment of the invention, a weighted PCA technique for reducing the data dimension.

FIG. 5 shows, in accordance with an embodiment of the invention, a weighted PCA technique for reducing the data dimension. Generally speaking, in PCA, correlations among channel variations are analyzed in order to reduce data dimension. For example, instead of representing the variation in 100 dimensional data space, one may capture most of the variations in fewer dimensional PCA space. In fault detection modeling, channel variations from normal samples to bad samples are desired to be captured in the PCA data space.

However, if the number of "bad" samples is very low compared to the number of "good" and "unknown" samples, the contribution from the "bad" samples may be too insignificant, making it difficult to capture this variation in the PCA data space.

In the weighted PCA technique of FIG. 5, there is predefined an acceptable threshold ratio of "bad" samples to "good" and "unknown" samples. If the number of "bad" samples to "good" and "unknown" samples is below this ratio, the "bad" samples are replicated until the threshold is reached. In so doing, it is possible to capture the desired variation between the "bad" sample(s) and the good/unknown samples even if the number of "bad" samples may be too low to enable the capture of the desired variation in the PCA data space otherwise.

With reference to FIG. 5, in step 502, a dataset comprising $N_1$ of "bad" samples and $N_2$ of "good" and/or "unknown" samples is prepared. In step 504, it is ascertained whether the number of "bad" samples $N_1$ is less than some predefined ratio of the number of "good" and/or "unknown" samples $N_2$. The purpose of step 504 is to ascertain whether the number of bad samples $N_1$ is too low to enable capturing of the desired variation contributed by the "bad" samples. In the implementation of FIG. 5, the ratio is set to be $\frac{1}{10}$ of $N_2$ although any suitable ratio may be used.

If there are insufficient "bad" samples $N_1$, the "bad" samples are replicated until there is a sufficient number of "bad" samples relative to the predefined ratio (step 506). At any rate, PCA is then performed (step 508) on the data set after measures are taken to ensure (in step 504) that there is a sufficient number of "bad" samples $N_1$.

In step 510, the principal components are retained to sufficiently capture 80% (or some other desired percentage) of the variation. Steps 508 and 510 are well-known to those familiar with PCA and will not be elaborated here.

Figure 6C:
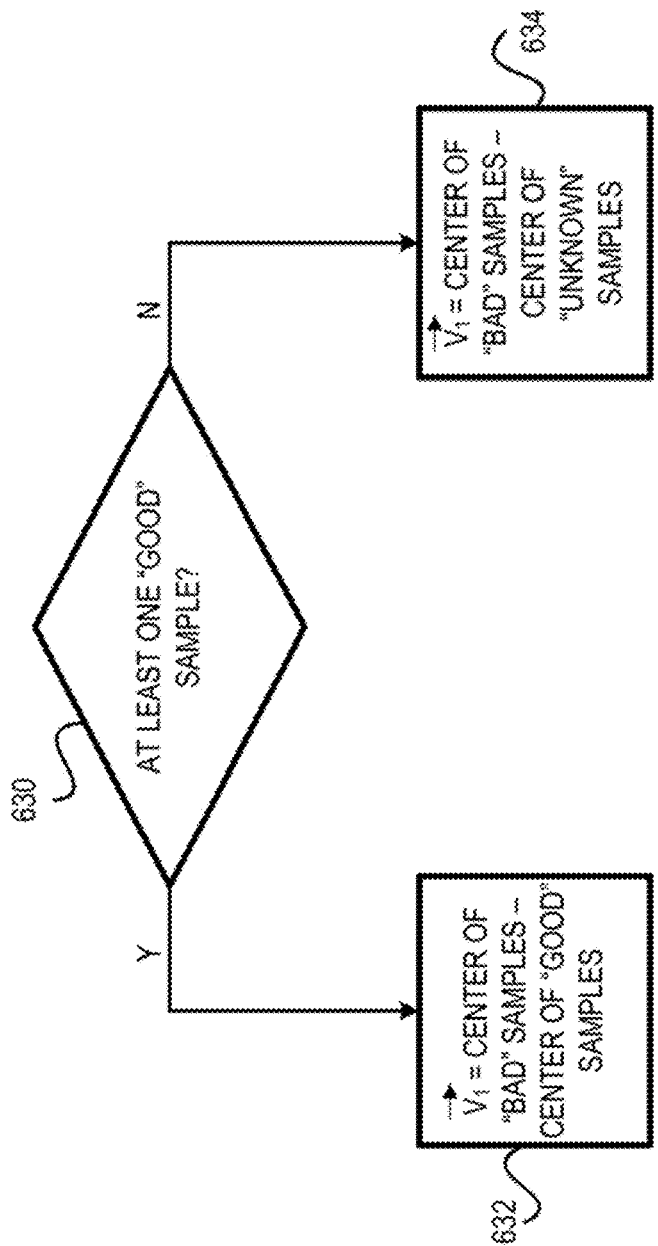

FIGS. 6A, 6B, 6C and 6D show, in accordance with an embodiment of the invention, the steps for defining the fault vector (representing the fault signature) while accounting for chamber drift automatically. In FIG. 6A, all the data samples are plotted in the reduced PCA data space (shown to be three-dimensional in FIG. 6A but may have as many data dimensions as desired from the PCA steps of FIG. 5). The uncorrected fault vector $V_1$ is defined to be a vector from the center of the "good" or, less preferably, "unknown" data samples to the center of the "bad" samples.

The vector $V_0$ is defined to be the chamber drift vector and is represented as shown in the reduced PCA data space of FIG. 6A. Chamber drift over time affects the plasma (which affects the center of the "good" samples, for example, as time goes by) and needs to be accounted for in order to improve the accuracy of the fault signature modeling. For example, if the "bad" samples are acquired at a different time frame relative to the "good" data samples, chamber drift may represent a non-trivial contribution to the variation between the "bad" samples and the "good" samples acquired earlier. By isolating the fault component from the chamber drift component in creating the fault signature, more accurate fault detection and analysis may be achieved. This is a significant improvement over the prior art.

Figure 6D:
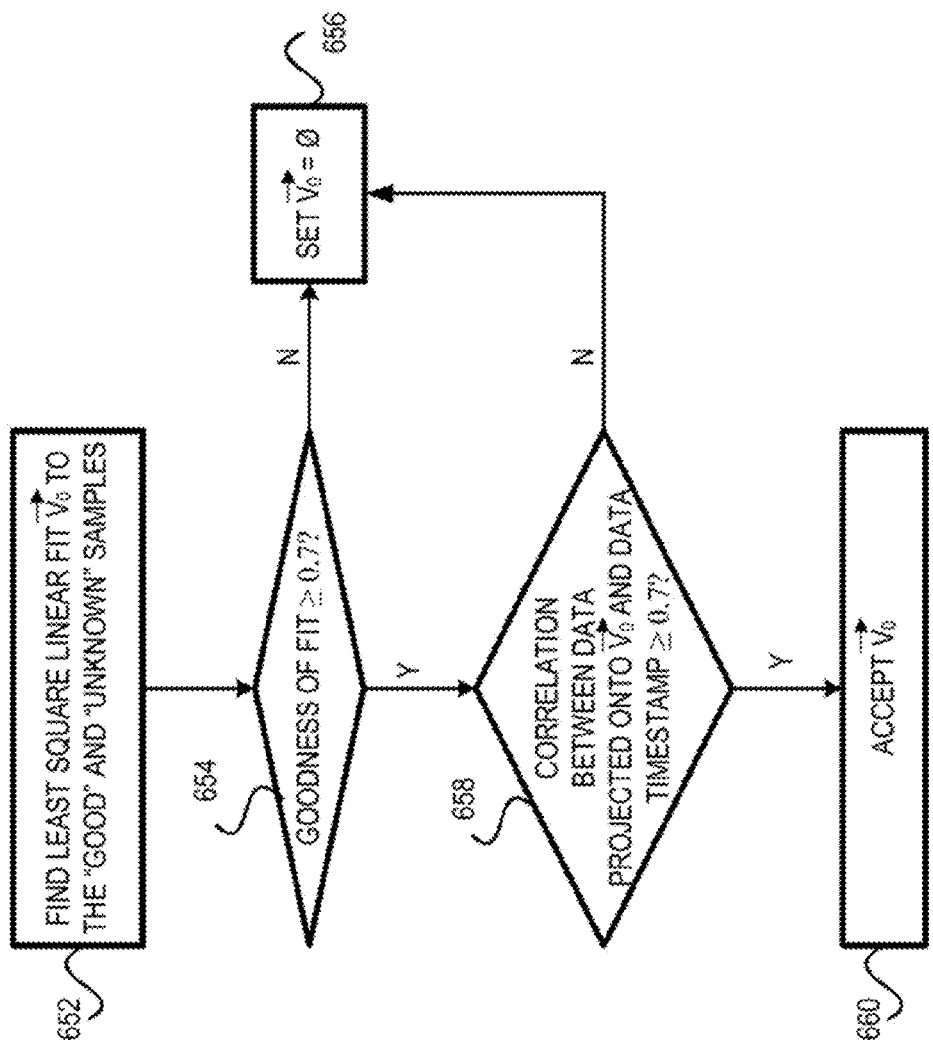

Corrected fault vector $V_F$ represents the vital components of uncorrected fault vector $V_1$ after accounting for the chamber drift. Mathematically speaking, the computation for corrected fault vector $V_F$ is shown in FIG. 6B. In FIG. 6B, the corrected fault vector $V_F$ equals the uncorrected fault vector $V_1$ minus the unit vector of the chamber drift ($V_0$) times the dot product of the uncorrected fault vector $V_1$ and the unit vector of chamber drift $V_0$. The corrected fault vector $V_F$ may be seen in FIG. 6A, lying along the line that connected the center of the "bad" samples to the drift vector $V_0$ and is normal to the drift vector $V_0$. The calculation of the uncorrected fault vector $V_1$ is shown in FIG. 6C, and the calculation of the drift vector $V_0$ is shown in FIG. 6D. From the uncorrected fault vector $V_1$ obtained using FIG. 6C, and the calculation of the drift vector $V_0$ obtained using FIG. 6D, the corrected fault vector may be found using the equation shown in FIG. 6B.

With reference to FIG. 6C, in step 630, it is ascertained whether there is at least one good sample tagged. A sample, to elaborate, includes the set of data characterizing the data channels for a single wafer. In the case of FIG. 6, the samples are in the PCA data space. If there is a good sample, then the uncorrected fault vector $V_1$ is defined from the center of "good" samples to the center of "bad" samples (step 632). Otherwise, the uncorrected fault vector $V_1$ is defined from the center of "unknown" samples to the center of "bad" samples (step 634). In other words, the center of the "good" samples is used if any "good" sample is present to define the uncorrected fault vector $V_1$.

With reference to FIG. 6D where the calculation of the drift vector $V_0$ is accomplished, a fitting technique (such as least square linear fit) is employed for all the "good" and "unknown" samples (step 652). If the goodness-of-fit is below (step 654) a certain threshold (0.7 in the example of FIG. 6D but may vary as desired), then the drift vector $V_0$ is set to be zero (step 656). On the other hand, if the goodness-of-fit is above (step 654) the threshold, then a further check is performed to see if the data samples projected onto this fitted $V_0$ correlate well with their time stamps (since the expectation is that the data samples will be distributed along the drift vector in the direction of drift with passing time).

Thus in step 658, the correlation between the data projected on to the fitted $V_0$ and their time stamps is ascertained. If the correlation exceeds another threshold (0.7 in the example of FIG. 6D but may vary also as desired), then the fitted $V_0$ is accepted as the drift vector (step 660). Otherwise, the drift vector $V_0$ is set to be zero (step 656).

Figures 7A, 7B, 7C:
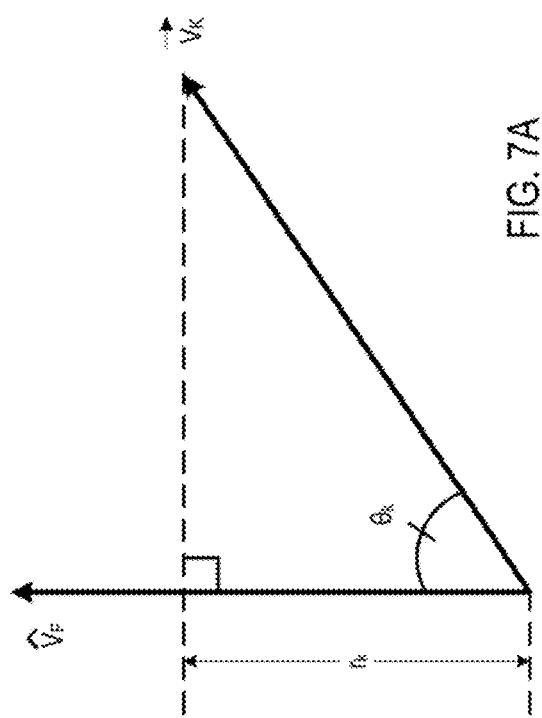
FIGS. 7A, 7B, and 7C show that the correlation can be quantified by the term r(k), representing the magnitude of the fault when the wafer sample vector $V_k$ is projected onto the fault vector $V_F$.

Once the fault vector $V_F$ is defined, the correlation between any wafer sample vector $V_k$ and the fault vector $V_F$ can be calculated to detect whether the wafer sample $V_k$ exhibits fault characteristics and, if applicable, to classify the fault (by iteratively comparing the wafer sample $V_k$ with different fault vectors representing different faults). FIG. 7A shows that the correlation can be quantified by the term r(k), representing the magnitude of the fault when the wafer sample vector $V_k$ is projected onto the fault vector $V_F$. Mathematically, this relationship is illustrated in FIG. 7B. Furthermore, the angle θ between the wafer sample vector $V_k$ and the fault vector $V_F$ reflects how closely the wafer sample resembles the fault. Mathematically, this relationship is illustrated in FIG. 7C.

The various samples can be calculated relative to the fault vector $V_F$ in order to obtain a display of data samples in a 2-D coordinate system, with each sample k being plotted at r(k), θ(k).

Figure 8:
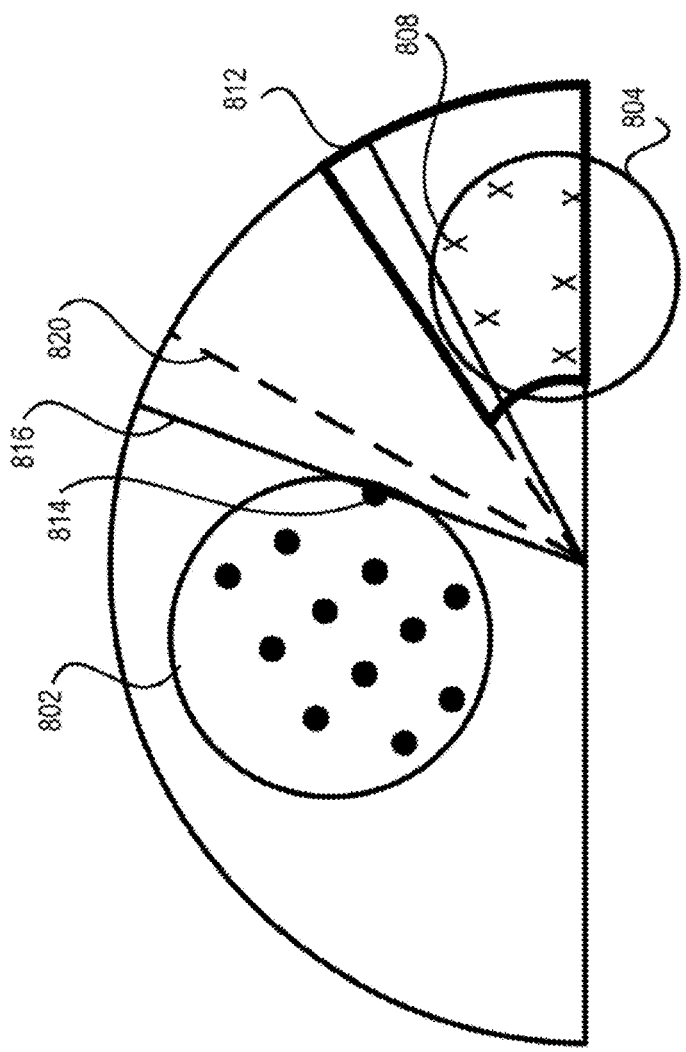
FIG. 8 shows, in accordance with an embodiment of the invention, the steps for setting the boundary for a fault signature.

FIG. 8 shows, in accordance with an embodiment of the invention, the steps for setting the boundary for a fault signature. Once the data samples are plotted in a 2-D coordinate system, with every sample plotted at r(k), θ(k), the boundary for a fault condition may be established. FIG. 8 shows an example of a 2-D data sample plot, with the "good" or "unknown" samples clustered within region 802. The "bad" samples are clustered within region 804. To set the boundary for the fault condition represented by the "bad" samples in region 804, a maximum θ(max) is identified for the "bad" sample that exhibits the greatest angle θ among the "bad" samples.

To provide for a margin of error, the angular boundary for the fault condition is some multiple (integer or non-integer multiple) of this maximum θ(max). In the example of FIG. 8, point 808 represents the sample with the maximum θ(max) from the horizontal axis (where θ=zero). The angle θ(max) associated with the sample of point 808 is multiplied by 1.2 (an arbitrary number and may vary if desired) to obtain the maximum boundary θ(b).

To provide for a margin of error, the radius r associated with the data sample having the smallest r(k) is identified. This minimum radius r(k) is multiplied by some fractional constant (0.8 in the example of FIG. 8 but may vary if desired). With reference to FIG. 8, the boundary 812 represents the boundary for the fault condition, and data samples falling within boundary 812 may be classified with that fault condition.

If there is only a single "bad" data point, the angle θ(b) that bounds the fault condition may alternatively reflect the parameter values outside of the "good" samples plus some margin. In an embodiment, the minimum θ(min) of all good/unknown samples is scaled by some fractional constant in order to derive the angle θ(b) that bounds the fault condition. With respect to FIG. 8, suppose point 814 represents the "good" sample with the smallest θ(min) value. Line 816 depicts this angle θ(min) associated with the minimum angle of the "good" or "unknown" samples. By scaling this minimum θ(min) by a fractional constant (0.8 in this example but the value may change as desired), the boundary angle θ(b) is obtained and is depicted by line 820 in FIG. 8.

Figure 9:
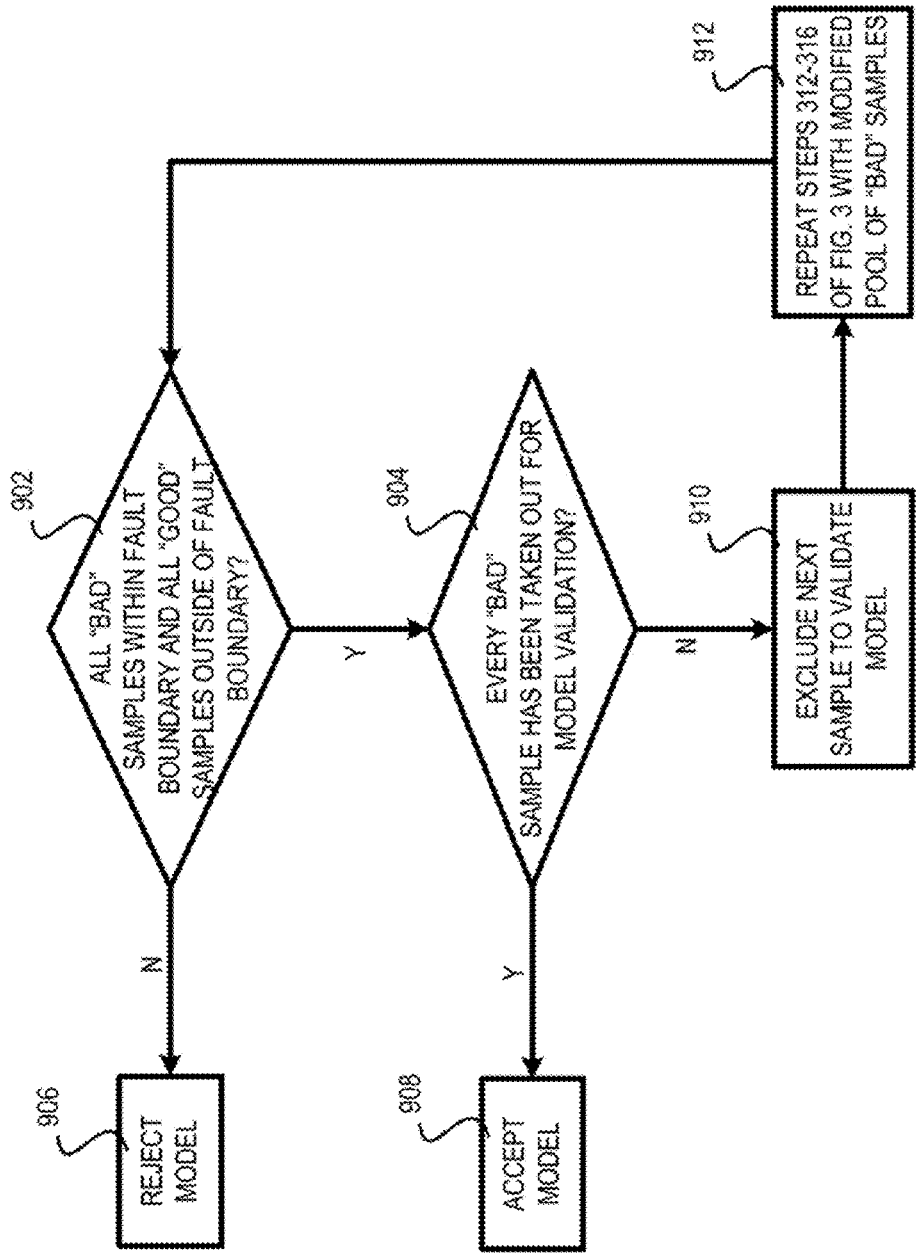
FIG. 9 shows, in accordance with an embodiment of the invention, the steps for validating a fault model.

FIG. 9 shows, in accordance with an embodiment of the invention, the steps for validating a fault model. In step 902, it is ascertained whether all the "bad" samples are within the fault boundary and whether all the "good" and "unknown" samples are outside the fault boundary. If not, the fault model is rejected (step 906). On the other hand, if both conditions of step 902 are true, it is further ascertained (step 904) if every "bad" sample has been taken out of the "bad" samples cluster at least once to iteratively re-validate the fault model. If every "bad" sample has been taken out of the "bad" sample cluster at least once to iteratively re-validate the fault model, and such re-validation has not triggered the rejection (step 902/906), then the model is accepted (step 908).

On the other hand, if there remains one or more "bad" samples to be taken out of the "bad" sample cluster to iteratively re-validate the fault model, the "bad" sample that has not been taken out is pulled out of the bad samples cluster to facilitate re-validation of the fault model (step 910). The fault vector and fault boundary calculations (steps 312-316 of FIG. 3) are performed again (in step 912) with the modified pool of "bad" samples. In an embodiment, each time a "bad" sample is pulled out of the "bad" sample cluster, the last "bad" sample pulled out is put back into the cluster. In this manner, the recalculation of the fault vector and fault boundary is performed with only one "bad" sample missing at a time. Of course it is possible to pull out a set of "bad" samples (and replace the last set) with every iteration in one or more other embodiments. In this case, the recalculation of the fault vector and fault boundary is performed with only one set of "bad" samples missing at a time.

Once all "bad" samples have been pulled out at least once and the fault model tests satisfactorily, the validation ends at step 908.

Figure 10:
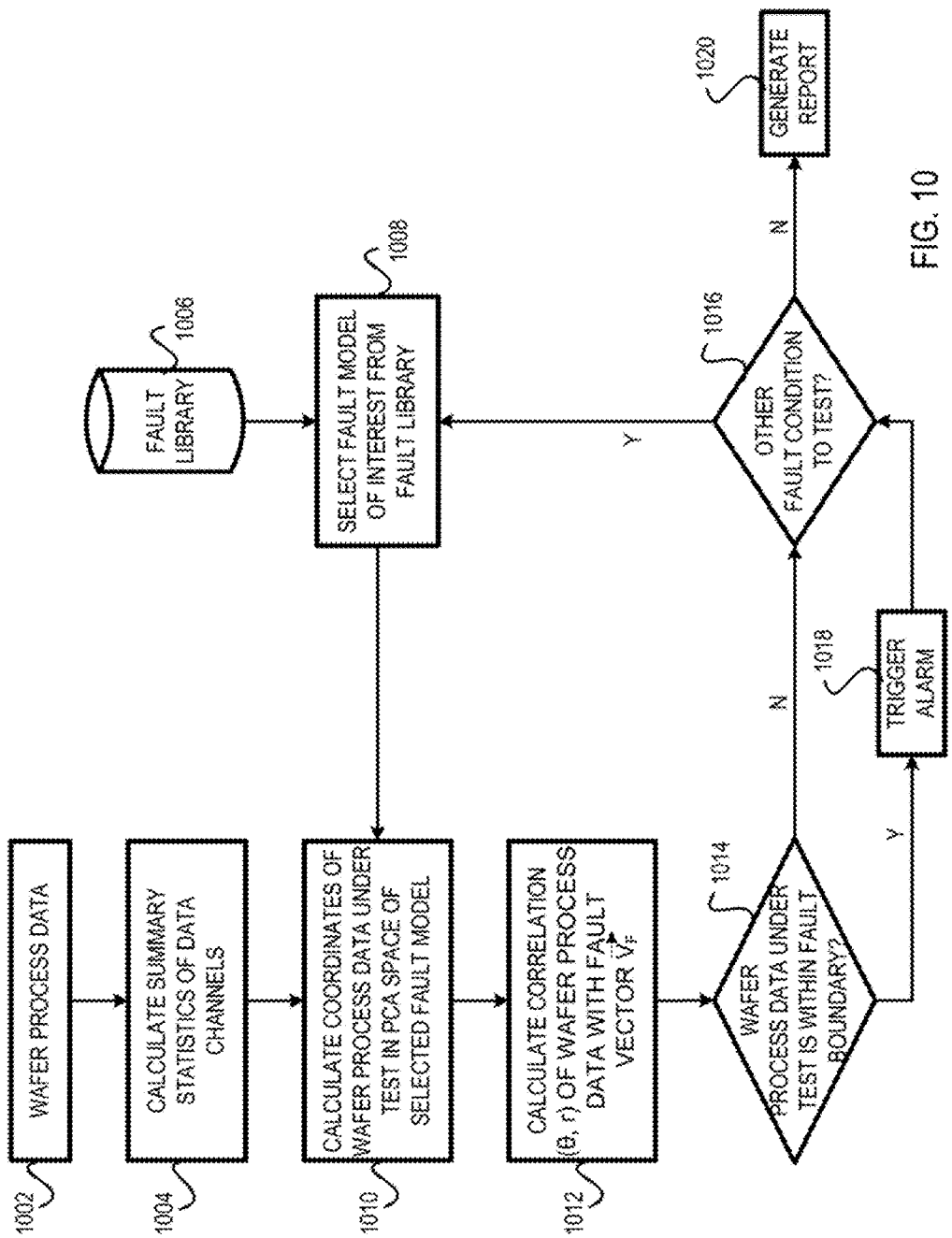
FIG. 10 shows, in accordance with an embodiment of the invention, the steps for detecting and/or classifying one or more fault conditions from the wafer process data.

FIG. 10 shows, in accordance with an embodiment of the invention, the steps for detecting and/or classifying one or more fault conditions from the wafer process data (block 1002). In step 1004, the summary statistics for the data channels are calculated. This calculation has been discussed earlier in connection with FIG. 4, for example.

FIG. 10 also shows a library of fault models (block 1006), representing a data store of pre-built fault models 1006. A fault model comprises the fault signature, the fault boundary, and the PCA parameters as discussed earlier. Different fault models may characterize different known faults (such as worn edge rings, broken ground straps, incorrect chamber gap, wrong pressure, etc.). A fault model from the library of fault models is selected for testing (step 1008).

In step 1010, the wafer process sensor data associated with the wafer under test is transformed into the same PCA space of the fault model selected in step 1008 to facilitate detection and classification against the selected fault model. In step 1012, the correlation (θ and r) of the wafer process data is computed against the fault vector $V_F$ associated with the fault model selected in step 1008. In step 1014, it is ascertained whether the wafer process data under test is within the fault boundary of the fault model selected in step 1008. If the wafer process data under test is within the fault boundary of the fault model selected in step 1008, an alarm is triggered in step 1018, indicating the detection of a possible fault and classifying the type of fault in accordance to the fault model selected in step 1008.

On the other hand, if the wafer process data under test is not within the fault boundary of the fault model selected in step 1008, the process moves to step 1016 to ascertain whether there is another fault condition to test again. In some cases, it may be desirable to test the wafer process data against other fault models even if a potential fault is already detected to determine whether there may be multiple possible faults. If it is ascertained that there is another fault condition to test, the process moves to step 1008 to select another fault model to test again. The process continues until it is ascertained in step 1016 that there are no another fault conditions to test. In step 1020, a report is generated to report the fault correlation result and/or any potential fault found/classified.

As can be appreciated from the foregoing, embodiments of the invention facilitate the automatic, efficient, and timely detection and classification of fault conditions despite the complexity of fault classification and the massive volume of sensor data involved.

More importantly, embodiments of the invention systemize and de-skill the process of fault model building. The human operator is no longer required to know which data channels to select for inclusion, how to account for baseline drift, and how to set boundary conditions. These decisions have been systemized and automated in the fault model building process. In some cases, all that is required to build a fault model is the identification of the fault condition and the tagging of the data sample associated with that wafer with the appropriate "bad" tag.

The inventive method then automatically performs data manipulation to pre-filter the data channels and further reduce the data dimensions of the wafer data via PCA. Among others, weighted PCA, automatic accounting for baseline (chamber) drift, and/or the inventive fault classification method based on fault model generation, 2-D data mapping and fault boundary setting render the fault model building process, fault detection and classification highly automated, robust and efficient.

While this invention has been described in terms of several embodiments, there are alterations, permutations, and equivalents, which fall within the scope of this invention. If the term "set" is employed herein, such term is intended to have its commonly understood mathematical meaning to cover zero, one, or more than one member. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for detecting a first fault condition of a plurality of fault conditions during processing of a first substrate, said method comprising:
   collecting first data via sensors during said processing of said substrate, wherein said first data includes a first set of samples and a second set of samples;
   sending said first data to a fault device;
   processing said first data via said fault device including
      determining a corrected fault vector including
         determining a drift vector corresponding to drift in one or more parameters of a plasma processing chamber,
         determining an uncorrected fault vector based on the first set of samples and the second set of samples, and
         based on the drift vector, correcting the uncorrected fault vector to generate the corrected fault vector, and
      comparing a first portion of said first data to a plurality of fault models stored within a fault library, wherein said plurality of fault models correspond respectively to said plurality of fault conditions, wherein said plurality of fault models include respective ones of (i) a plurality of fault vectors, (ii) a plurality of fault boundaries, and (iii) sets of principal component analysis (PCA) parameters, and wherein said plurality of fault vectors include said corrected fault vector; and
   detecting said first fault condition based on said comparing of said first portion of said first data to said plurality of fault models.

2. The method of claim 1, wherein said processing of said first data by said fault device includes:
   calculating summary statistic values for each channel of said sensors; and
   pre-filtering said first data to exclude a second portion of said first data from a first set of channels of said sensors, wherein said first set of channels are invariant to said plurality of fault conditions.

3. The method of claim 2, wherein:
   said processing of said data includes performing weighted PCA on said first portion of said first data from a second set of channels of said sensors; and
   said first portion of said first data from said second set of channels does not include said second portion of said first data from said first set of channels.

4. The method of claim 3, wherein:
   said processing of said first data includes generating a set of data samples, represented in a multi-dimensional PCA space, based on one of said sets of PCA parameters;
   said drift vector is based on said set of samples as represented in said multi-dimensional PCA space; and
   said drift of said plasma processing chamber is represented by said drift vector in said multi-dimensional PCA space.

5. The method of claim 4, wherein said comparing of said first portion of said first data to said plurality of faults models includes determining a correlation value for said data based on a fault vector of a first fault model of said plurality of fault models.

6. The method of claim 5, wherein:
   said comparing of said first portion of said first data to said plurality of fault models includes determining if said first portion of said first data is within a fault boundary of said first fault model;

if said first portion of said first data is within said fault boundary of said first fault model, generating a warning signal indicating a possible fault condition; and if said first portion of said first data is outside of said fault boundary of said first fault model, identifying a second fault model of said plurality of fault models and comparing said first portion of said first data to said second fault model.

7. The method of claim 1, wherein each of said plurality of fault models is generated by:

collecting sets of data from said sensors respectively for a plurality of substrates, wherein said sets of data include said first data, and wherein said plurality of substrates include said first substrate;

assigning designations respectively to said sets of data, wherein each of said designations is identified as a bad set of data, a good set of data, or an unknown set of data; and pre-filtering a plurality of channels of said sensors to exclude data from a first portion of said plurality of channels of said sensors, wherein said first portion of said plurality of channels does not contribute to fault detection, wherein said pre-filtering includes calculating, for each of said plurality of substrates, a summary of statistical values for a second portion of said plurality of channels.

8. The method of claim 7, wherein each of said designations is based on conditions of components with said plasma processing chamber and conditions of one of said plurality of substrates.

9. The method of claim 7, wherein said calculating of said summary of statistical values includes applying a local linear fit to said set of data.

10. The method of claim 7, wherein said pre-filtering further includes calculating a variation in said summary of statistical values.

11. A system for detecting a first fault condition of a plurality of fault conditions during processing of a first substrate within a plasma processing chamber, the system comprising:

sensors configured for monitoring said plasma processing chamber during said processing of said first substrate;

a fault library configured to store a plurality of fault models, wherein each of said plurality of fault models correspond respectively to said plurality of fault conditions; and a fault device configured to (i) collect first data from said sensors, wherein said first data includes a first set of samples and a second set of samples, and (ii) analyze a first portion of said first data including determining a corrected fault vector including determining a drift vector corresponding to drift in one or more parameters of said plasma processing chamber, determining an uncorrected fault vector based on the first set of samples and the second set of samples, and based on the drift vector, correcting the uncorrected fault vector to generate the corrected fault vector, comparing said first portion of said first data to at least one of said plurality of fault models, wherein said plurality of fault models include respective ones of (i) a plurality of fault vectors, (ii) a plurality of fault boundaries, and sets of principal component analysis (PCA) parameters, wherein said plurality of fault vectors include said corrected fault vector, and wherein said at least one of said plurality of fault models includes said corrected fault vector, and detecting said first fault condition based on said comparing of said first portion of said first data to said at least one of said plurality of fault models.

12. The system of claim 11, further including a controller configured to control said plasma processing system based on outputs of said fault device.

13. The system of claim 11, wherein said fault device is configured to:

calculate summary statistic values for each channel of said sensors; and pre-filter said first data to exclude a second portion of said first data from a first set of channels of said sensors, wherein said first set of channels are invariant to said plurality of fault conditions.

14. The system of claim 13, wherein:

said fault device is configured to perform a weighted PCA on said first portion of said first data from a second set of channels of said sensors; and said first portion of said first data from said second set of channels does not include said second portion of said first data from said first set of channels.

15. The system of claim 14, wherein:

said fault device is configured to generate a set of data samples, represented in a multi-dimensional PCA space, based on one of said sets of PCA parameters;

said drift vector is based on said set of samples as represented in said multi-dimensional PCA space; and said drift of said plasma processing chamber is represented by said drift vector in said multi-dimensional PCA space.

16. The system of claim 15, wherein said fault device is configured to determine a correlation value for said first data based on a fault vector of a first fault model of said plurality of fault model.

17. The system of claim 16, wherein said fault device is configured to:

compare said first portion of said first data to said plurality of fault models;

determine if said first portion of said first data is within a fault boundary of said first fault model;

if said first portion of said first data is within said fault boundary of said first fault model, generate a warning signal indicating a possible fault condition; and if said first portion of said first data is outside of said fault boundary of said first fault model, identify a second fault model of said plurality of fault models and compare said first portion of said first data to said second fault model.

18. The system of claim 11, wherein said fault device is configured to generate each of said plurality of fault models by:

collecting sets of data from said sensors respectively for a plurality of substrates, wherein said sets of data include said first data, and wherein said plurality of substrates include said first substrate;

assigning designations respectively to said sets of data, wherein each of said designations is identified as a bad set of data, a good set of data, or an unknown set of data; and pre-filtering a plurality of channels of said sensors to exclude data from a first portion of said plurality of channels of said sensors, wherein said first portion of said plurality of channels do not contribute to fault detection, wherein said pre-filtering includes calculating, for each of said plurality of substrates, a summary of statistical values for a second portion of said plurality of channels.

19. The system of claim 18, wherein each of said designations is based on conditions of components with said plasma processing chamber and conditions of one of said plurality of substrates.

20. The system of claim 18, wherein said fault device is configured to while calculating said summary of statistical values, apply a local linear fit to said sets of data.

21. The method of claim 1, wherein said corrected fault vector is normal to said drift vector.

22. The method of claim 1, wherein:
said drift vector passes between two of said first set of samples, wherein said first set of samples are identified as good samples;
said uncorrected fault vector has a first initial point on said drift vector and extends between two of said second set of samples, wherein said second set of samples are identified as bad samples; and
said corrected fault vector has a second initial point on said drift vector and extends between two of said second set of samples.

23. The method of claim 1, wherein said corrected fault vector is equal to said uncorrected fault vector minus a first unit vector multiplied by a product of a second unit vector and said drift vector.

24. The method of claim 23, wherein:
said first unit vector corresponds to said drift vector; and
said second unit vector corresponds to said uncorrected fault vector.

25. The method of claim 1, further comprising:
performing a least square linear fit of said drift vector to said first set of samples;
if a result of said least square linear fit is less than a first predetermined value, setting said drift vector to zero;
if said result of said least square linear fit is greater than or equal to said first predetermined value, determining a correlation value based on (i) the first set of samples as projected onto said drift vector, and (ii) corresponding timestamps;
if the correlation value is less than a second predetermined value, setting said drift vector to zero; and
if the correlation value is greater than or equal to the second predetermined value, accepting said drift vector.

* * * * *